United States Patent
Huang

(10) Patent No.: US 11,038,060 B2
(45) Date of Patent: Jun. 15, 2021

(54) SEMICONDUCTOR DEVICE WITH EMBEDDED SIGMA-SHAPED STRUCTURE AND METHOD FOR PREPARING THE SAME

(71) Applicant: NANYA TECHNOLOGY CORPORATION, New Taipei (TW)

(72) Inventor: Teng-Yen Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/547,160

(22) Filed: Aug. 21, 2019

(65) Prior Publication Data
US 2021/0057566 A1  Feb. 25, 2021

(51) Int. Cl.
*H01L 29/78* (2006.01)
*H01L 29/66* (2006.01)
*H01L 21/768* (2006.01)

(52) U.S. Cl.
CPC ...... *H01L 29/785* (2013.01); *H01L 21/76816* (2013.01); *H01L 21/76877* (2013.01); *H01L 29/66795* (2013.01); *H01L 29/7848* (2013.01)

(58) Field of Classification Search
CPC ............. H01L 29/4236; H01L 29/7813; H01L 29/785; H01L 29/78; H01L 29/7851
See application file for complete search history.

(56) References Cited

U.S. PATENT DOCUMENTS

| | | | |
|---|---|---|---|
| 5,449,630 A * | 9/1995 | Lur | H01L 27/10829 257/E21.396 |
| 10,090,287 B1 * | 10/2018 | Adusumilli | H01L 29/66181 |
| 10,096,713 B1 * | 10/2018 | Guo | H01L 21/0245 |
| 2012/0086064 A1 * | 4/2012 | Cheng | H01L 29/945 257/301 |
| 2013/0320434 A1 * | 12/2013 | Shin | H01L 29/513 257/329 |
| 2016/0181383 A1 * | 6/2016 | Huang | H01L 29/41758 257/757 |
| 2018/0358465 A1 | 12/2018 | Guo | |

* cited by examiner

*Primary Examiner* — Zandra V Smith
*Assistant Examiner* — John M Parker
(74) *Attorney, Agent, or Firm* — Muncy, Geissler, Olds & Lowe, P.C.

(57) ABSTRACT

The present disclosure provides a semiconductor device and a preparation method thereof. The semiconductor device includes a semiconductor substrate, a semiconductor fin and a filled trench. The semiconductor fin extends upwards from the semiconductor substrate. The filled trench is formed in the semiconductor fin and includes a first sigma portion, a second sigma portion and a middle portion. The first sigma portion is partially filled by a semiconductor buffer region, and an unfilled part of the first sigma portion is filled by a doped semiconductor region grown on the semiconductor buffer region. The second sigma portion is filled by the semiconductor buffer region. The middle portion connects the first sigma portion to the second sigma portion, and the middle portion is filled by the semiconductor buffer region.

12 Claims, 10 Drawing Sheets

SEMICONDUCTOR DEVICE WITH EMBEDDED SIGMA-SHAPED STRUCTURE AND METHOD FOR PREPARING THE SAME

TECHNICAL FIELD

The present disclosure relates to a semiconductor device and method for preparing the same, and more particularly, to a semiconductor device with an embedded sigma-shaped structure and a method for preparing the same.

DISCUSSION OF THE BACKGROUND

In modern electronic devices, integrated circuits (ICs) serve a continuously expanding range of applications. In particular, demand for increasing mobility of electronic devices that exhibit high performance and low energy consumption drives development to ever more compact devices having features with sizes ranging down into the low submicron scale. Current semiconductor technologies are capable of producing structures with dimensions in the magnitude of 10 nm. Because an IC represents a set of electronic circuit elements integrated on a semiconductor material, ICs can be made much smaller than discreet circuits composed of independent circuit components. Typically, present-day integrated circuits involve millions of single circuit elements formed on a semiconductor substrate.

In order to enhance channel strain, embedding "sigma-shaped" structures in source/drain regions of a FinFET has proven to be an effective approach. In one known approach, gate structures are formed over a semiconductor fin, and a sigma-shaped source/drain structure is embedded in a sigma cavity between the gate structures. The sigma-shaped source/drain structure allows the source/drain structure to be positioned in close proximity to the transistor channel region and therefore maximizes stress inside the transistor channel region. However, for FinFETs, the subsequent drive-in anneal performed on such sigma-shaped source/drain structure results in a non-uniform junction profile, along the fin height direction, causing inconsistency in gate length within each semiconductor fin. Therefore, an embedded source/drain structure and process that provide a uniform source/drain junction profile are needed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present invention provides a semiconductor device including a semiconductor substrate, a semiconductor fin and a filled trench. The semiconductor fin extends upwards from the semiconductor substrate. The filled trench is formed in the semiconductor fin and includes a first sigma portion, a second sigma portion and a middle portion. The first sigma portion is partially filled by a semiconductor buffer region, and an unfilled part of the first sigma portion is filled by a doped semiconductor region grown on the semiconductor buffer region. The second sigma portion is filled by the semiconductor buffer region. The middle portion connects the first sigma portion to the second sigma portion, and the middle portion is filled by the semiconductor buffer region.

In some embodiments, the semiconductor device further comprises a gate structure formed over the semiconductor fin, wherein the gate structure includes a gate stack straddling a channel portion of the semiconductor fin and a gate spacer present on sidewalls of the gate stack.

In some embodiments, the first sigma portion includes a horizontal tip region extending beneath the gate spacer and a bottom region extending toward the semiconductor substrate.

In some embodiments, the semiconductor buffer region fills the horizontal tip region and the bottom region of the first sigma portion.

In some embodiments, the filled trench has sidewalls vertically coincident with outer sidewalls of the gate spacer.

In some embodiments, the second sigma portion has a depth greater than that of the first sigma portion.

Another aspect of the present invention provides a method for preparing a semiconductor device. The method includes steps of providing a semiconductor substrate; forming a trench in the semiconductor substrate, wherein the trench includes a first sigma portion, a second sigma portion and a middle portion connecting the first and second sigma portions; epitaxially growing a semiconductor buffer region in the trench, wherein the semiconductor buffer region fills the second sigma portion, the middle portion and a part of the first sigma portion; and epitaxially growing a doped semiconductor region on the semiconductor buffer region, wherein the doped semiconductor region fills an unfilled part of the first sigma portion.

In some embodiments, the method further comprises: forming a gate structure over a semiconductor fin that extends upwards from the semiconductor substrate, wherein the gate structure comprises a gate stack straddling a channel portion of the semiconductor fin and a gate spacer present on sidewalls of the gate stack; and forming a horizontal tip region extending beneath the gate spacer and a bottom region extending toward the semiconductor substrate portion in the first sigma portion.

In some embodiments, forming the trench further comprises: forming an initial cavity by performing an anisotropic etch to remove a portion of the semiconductor fin located on each side of the gate structure, wherein the initial cavity has a sidewall vertically coincident with an outer sidewall of the gate spacer; and forming an oxide collar on a middle portion of sidewalls of the initial cavity.

In some embodiments, forming the trench further comprises performing a crystallographic anisotropic etch to form the first sigma portion above the oxide collar and the second sigma portion below the oxide collar, wherein the first and second sigma portions have faceted surfaces oriented along (111).

In some embodiments, forming the trench further comprises removing the oxide collar from the middle portion of the sidewalls of the initial cavity, such that the middle portion of the trench connects the first sigma portion and the second sigma portion.

In some embodiments, the crystallographic anisotropic etch uses etchant including at least one of tetramethylammonium hydroxide (TMAH), ammonium hydroxide and potassium hydroxide.

In some embodiments, the etchant etches (001) and (110) crystallographic planes faster than (111) crystallographic planes.

Another aspect of the present invention provides a method for preparing a semiconductor device. The method includes steps of providing a semiconductor substrate; forming an initial cavity by performing an anisotropic etch to remove a portion of a semiconductor fin located on each side of a gate structure; forming an oxide collar on a middle portion of sidewalls of the initial cavity; performing a crystallographic anisotropic etch to form a first sigma portion above the oxide collar and a second sigma portion below the oxide collar; and removing the oxide collar from the middle portion of the sidewalls of the initial cavity so as to obtain a trench including a first sigma portion, a second sigma portion and a middle portion connecting the first sigma portion and the second sigma portion.

In some embodiments, the method further comprises: forming a gate structure over a semiconductor fin that extends upwards from the semiconductor substrate, wherein the gate structure comprises a gate stack straddling a channel portion of the semiconductor fin and a gate spacer present on sidewalls of the gate stack; and forming a horizontal tip region extending beneath the gate spacer and a bottom region extending toward the semiconductor substrate portion in the first sigma portion.

In some embodiments, the initial cavity has a sidewall vertically coincident with an outer sidewall of the gate spacer.

In some embodiments, the first and second sigma portions have faceted surfaces oriented along (111).

In some embodiments, the method further comprises: epitaxially growing a semiconductor buffer region in the trench, wherein the semiconductor buffer region fills the second sigma portion, the middle portion and a part of the first sigma portion; and epitaxially growing a doped semiconductor region on the semiconductor buffer region, wherein the doped semiconductor region fills an unfilled part of the first sigma portion.

In some embodiments, the semiconductor buffer region fills the horizontal tip region and the bottom region of the first sigma portion.

In some embodiments, the second sigma portion has a depth greater than that of the first sigma portion.

With the above-mentioned configurations of the semiconductor device and methods for preparing the same, the volume of each source/drain cavity is increased, and more stress-generating material can be deposited therein so as to create more stress on the channel regions of the FinFETs. As a result, the operating speed of the FinFETs can be greatly enhanced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
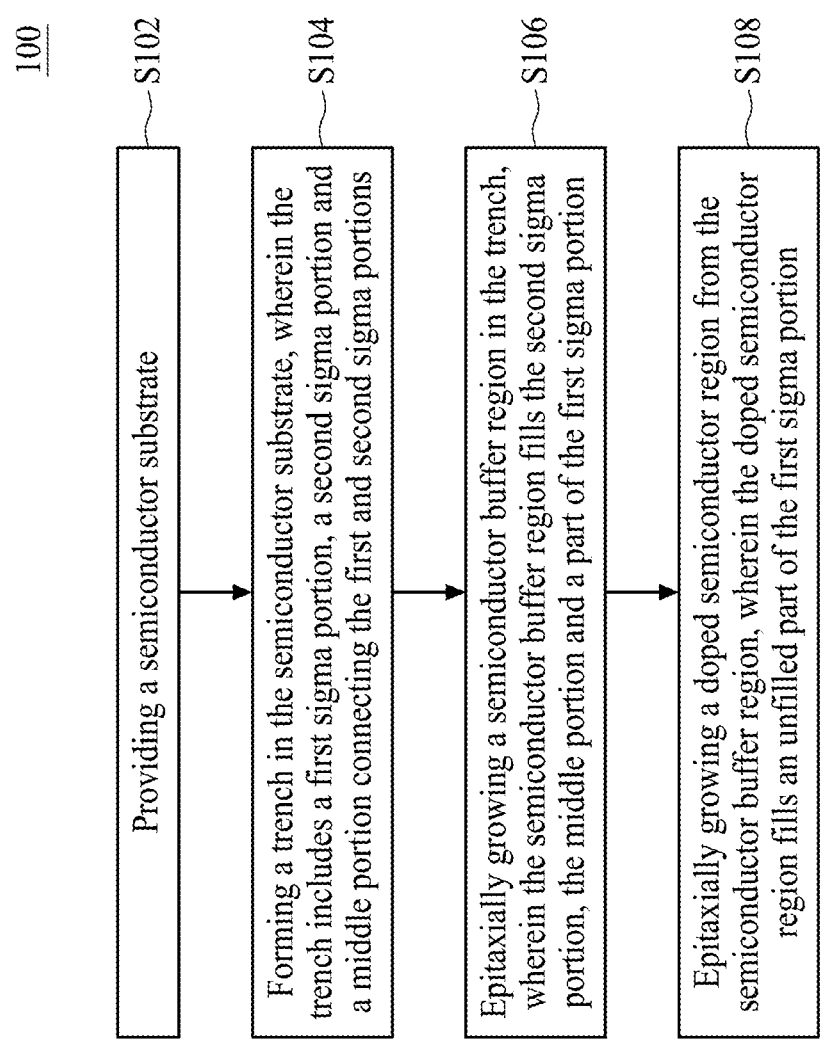
FIG. 1 is a flow chart showing a method for preparing a semiconductor device according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 3A:
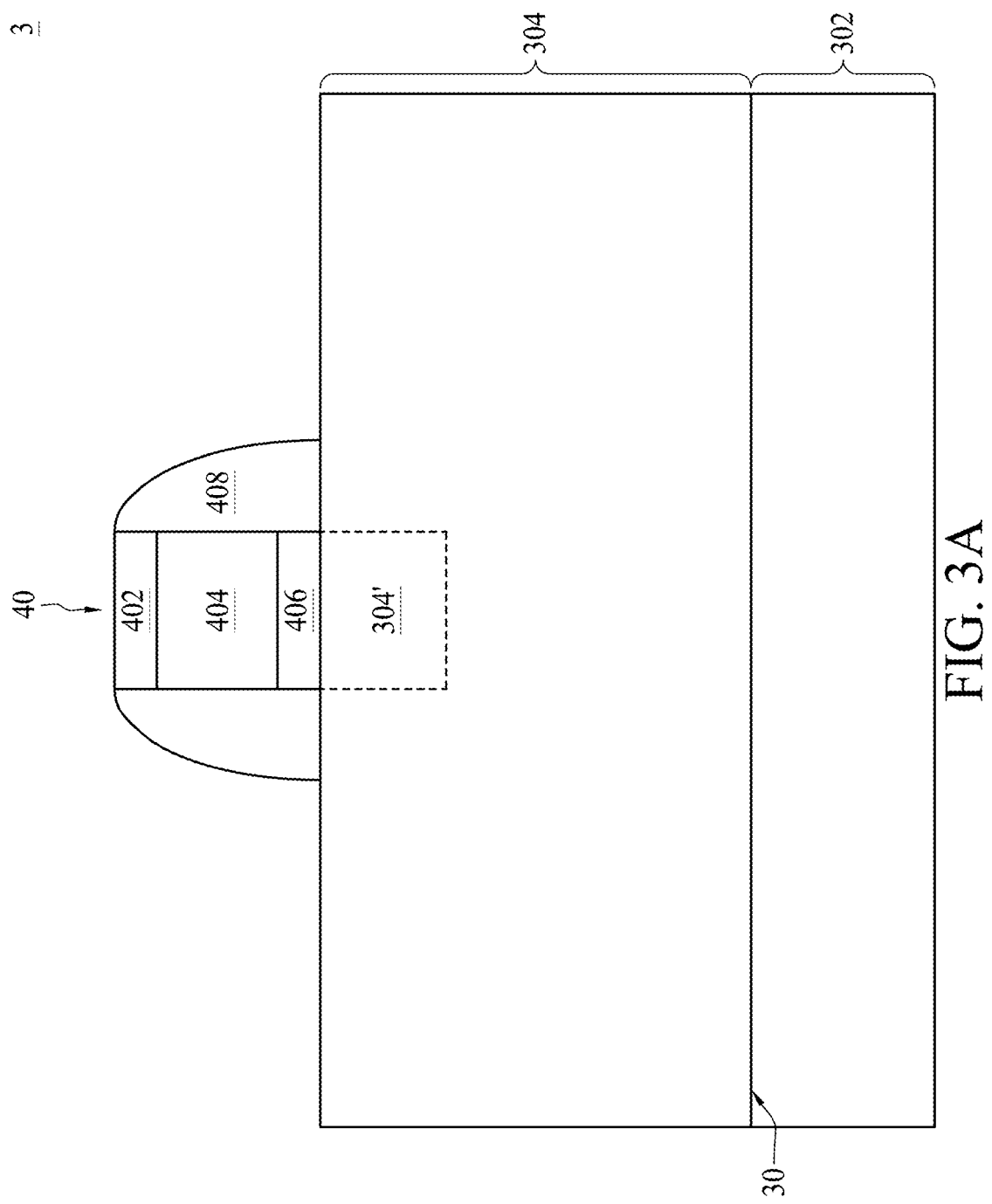
FIG. 3A is a cross-sectional view of an exemplary semiconductor device according to an embodiment of the present application that includes a semiconductor fin extending upwards from a semiconductor substrate and a gate structure formed over the semiconductor fin, wherein the cross-sectional view is taken along a direction parallel to a lengthwise direction of the semiconductor fin.
Figure 3B:
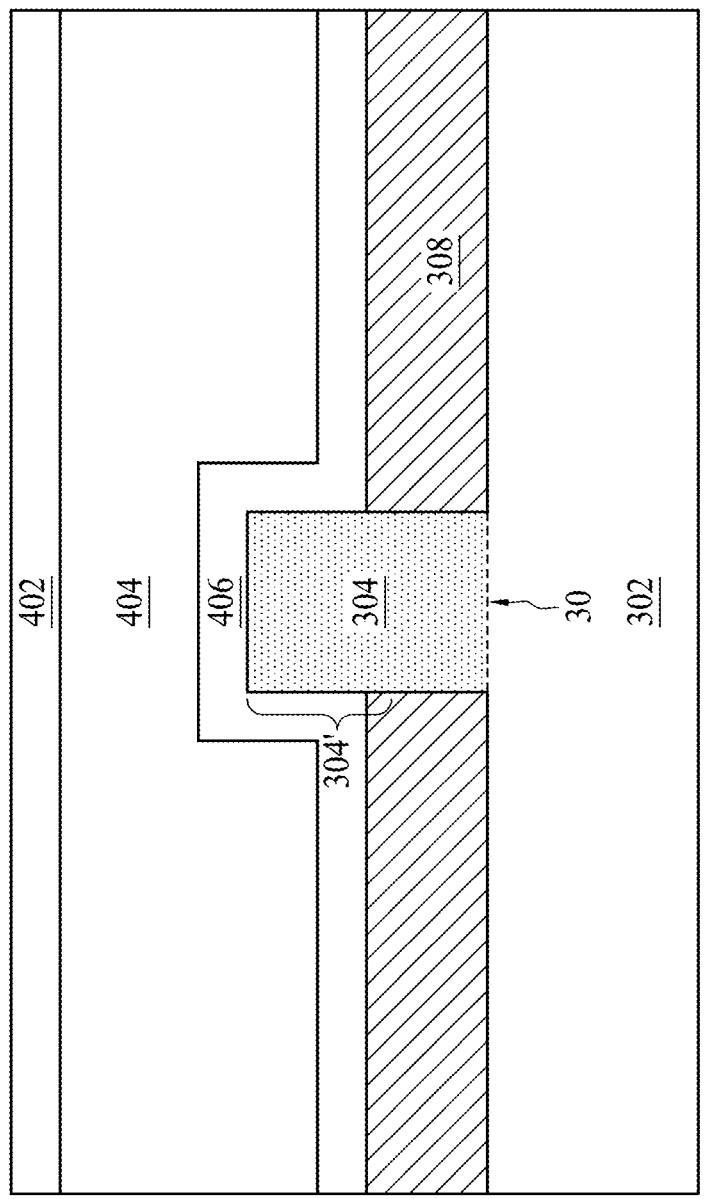
FIG. 3B is another cross-sectional view of the exemplary semiconductor device of FIG. 3A taken along a direction perpendicular to the lengthwise direction of the semiconductor fin.
Figure 7:
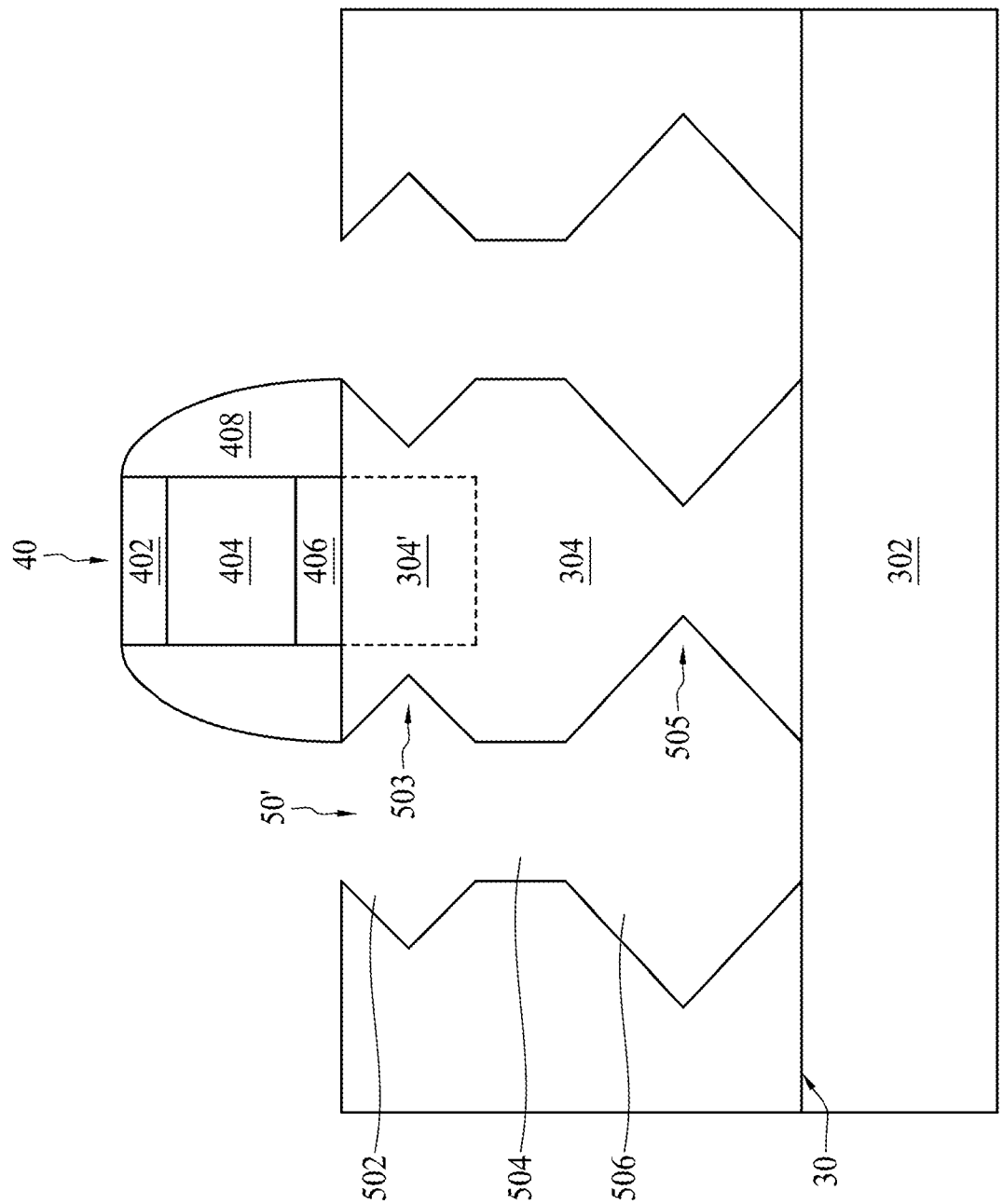
FIG. 7 is a cross-sectional view of the exemplary semiconductor device of FIG. 6 after removing the oxide collars from the sidewalls of the initial cavities.
Figure 8:
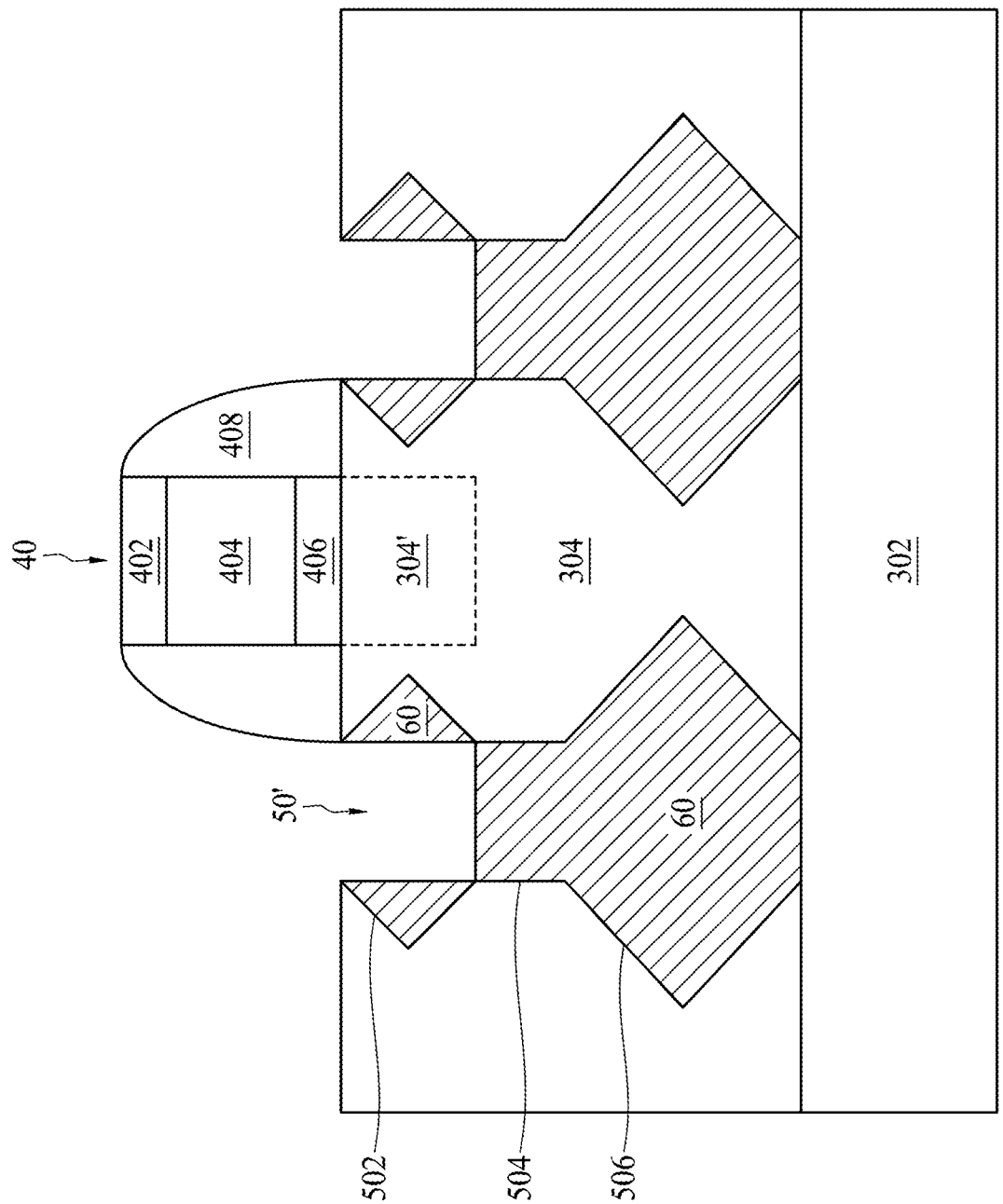
FIG. 8 is a cross-sectional view of the exemplary semiconductor device of FIG. 7 after epitaxially growing a semiconductor buffer region on (111) faceted surfaces of each first sigma portion.
Figure 9:
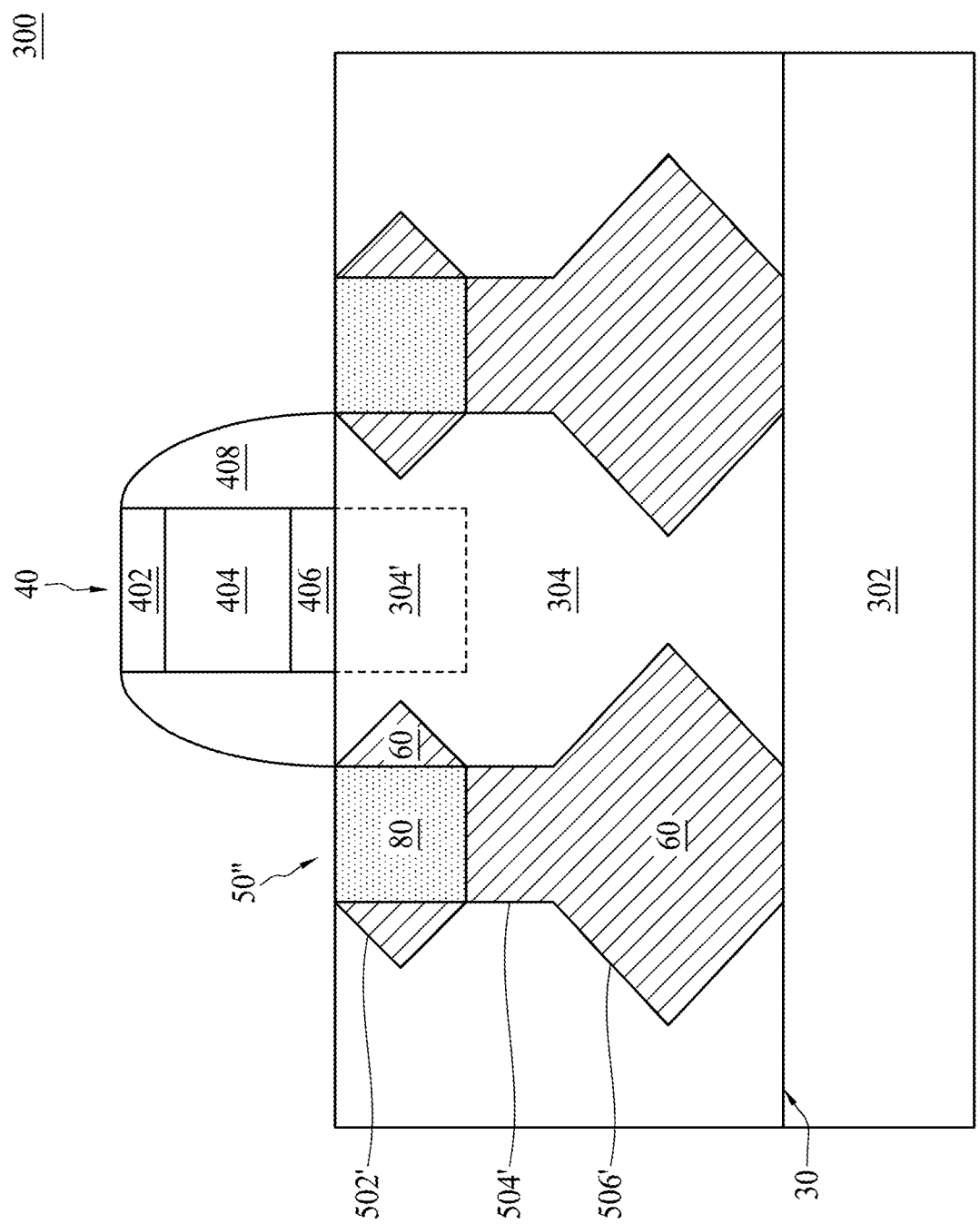
FIG. 9 is a cross-sectional view of the exemplary semiconductor device of FIG. 8 after forming a doped semiconductor region on each semiconductor buffer region.

FIG. 1 is a flowchart showing a method 100 for preparing a semiconductor device 3 in accordance with an embodiment of the present disclosure. In some embodiments, the method 100 includes a number of steps (S102, S104, S106 and S108) and the description and illustrations below are not deemed as a limitation to the sequence of the steps. In step S102, a semiconductor substrate 302 is provided as shown in FIGS. 3A to 3B. In step S104, a trench 50' is formed in the semiconductor substrate 302 as shown in FIG. 7. In some embodiments, the trench 50' includes a first sigma portion 502, a second sigma portion 506 and a middle portion 504 connecting the first and second sigma portions. In step S106, a semiconductor buffer region 60 is epitaxially grown in the trench 50'. In some embodiments, the semiconductor buffer region 60 fills the second sigma portion 506, the middle portion 504 and a part of the first sigma portion 502 as shown in FIG. 8. In step S108, a doped semiconductor region 80 is epitaxially grown on the semiconductor buffer region 60 as shown in FIG. 9. In some embodiments, the doped semiconductor region 80 fills an unfilled part of the first sigma portion 502.

Figure 2:
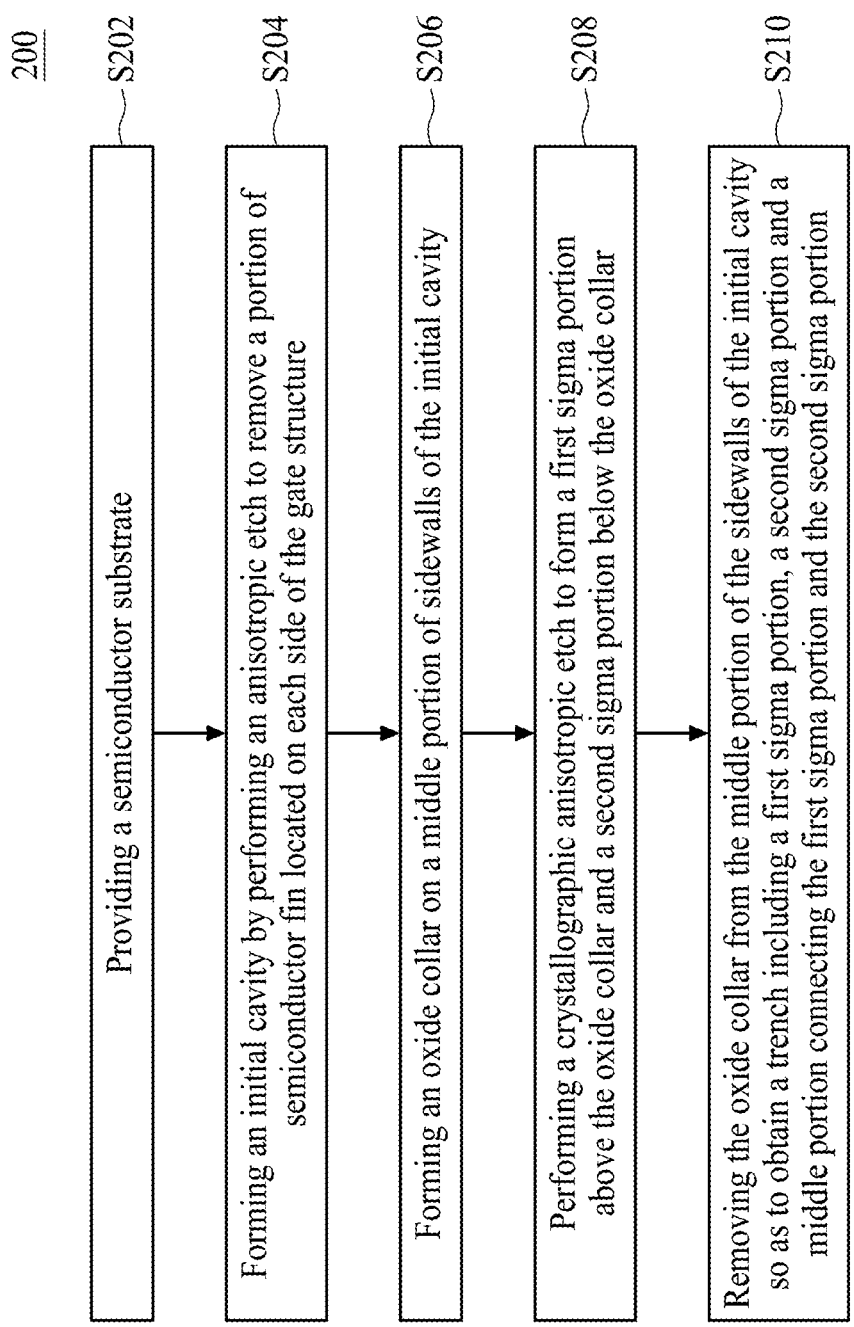
FIG. 2 is a flow chart showing a method for preparing a semiconductor device according to an embodiment of the present disclosure.
Figure 4:
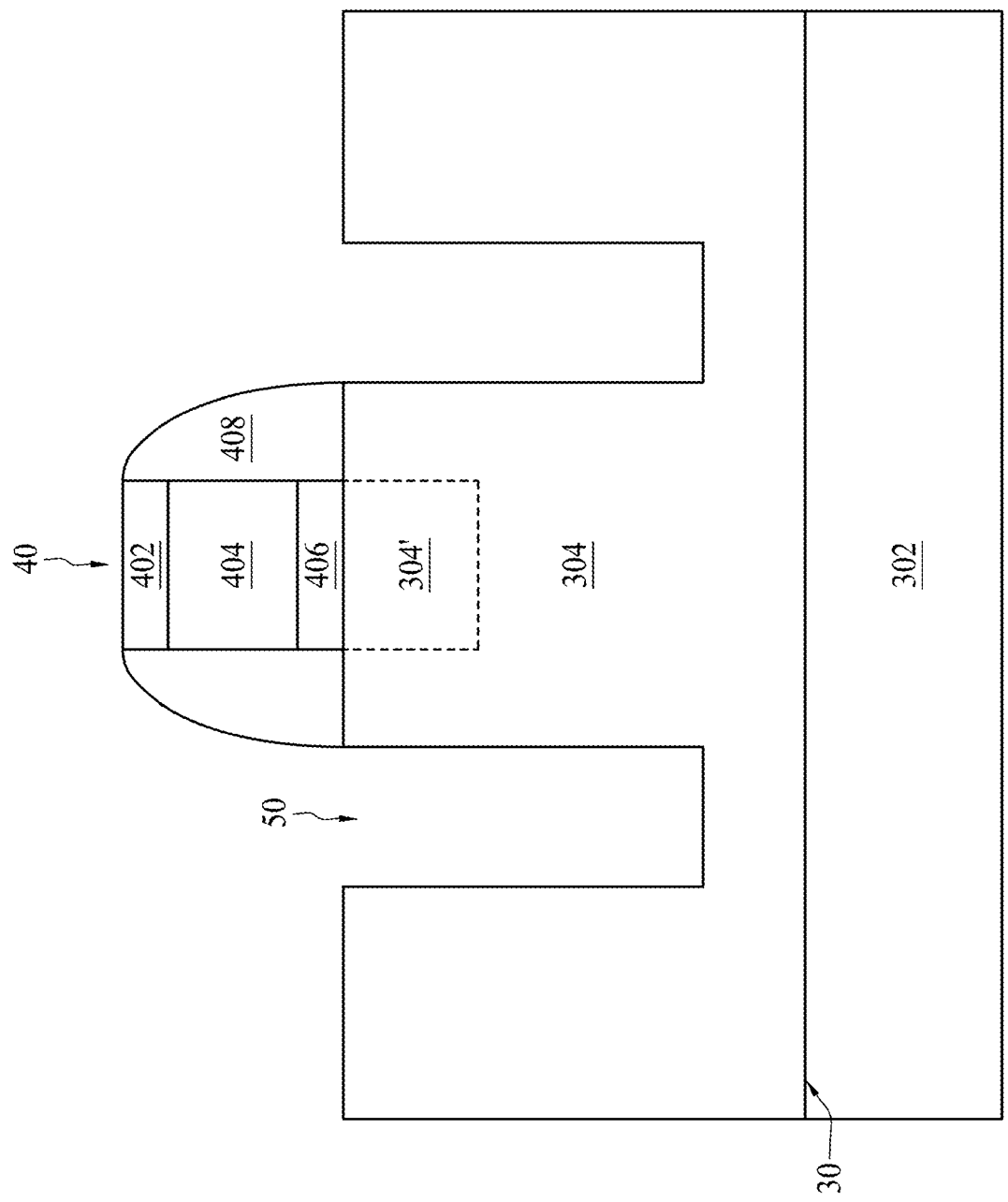
FIG. 4 is a cross-sectional view of the exemplary semiconductor device of FIG. 3A after forming initial cavities within the semiconductor fin on opposites sides of the gate structures.
Figure 5:
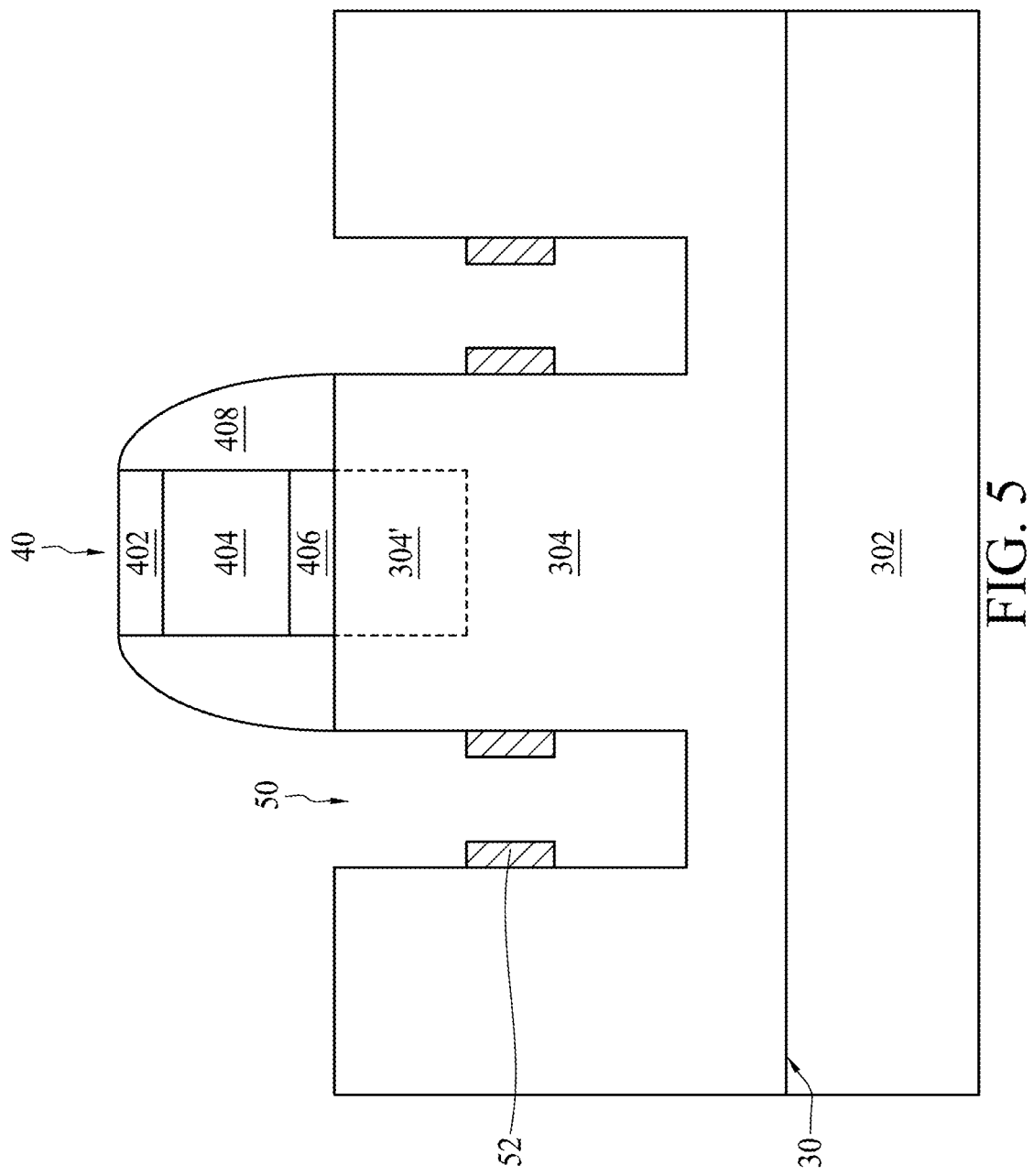
FIG. 5 is a cross-sectional view of the exemplary semiconductor device of FIG. 4 after forming oxide collars on sidewalls of the initial cavities.
Figure 6:
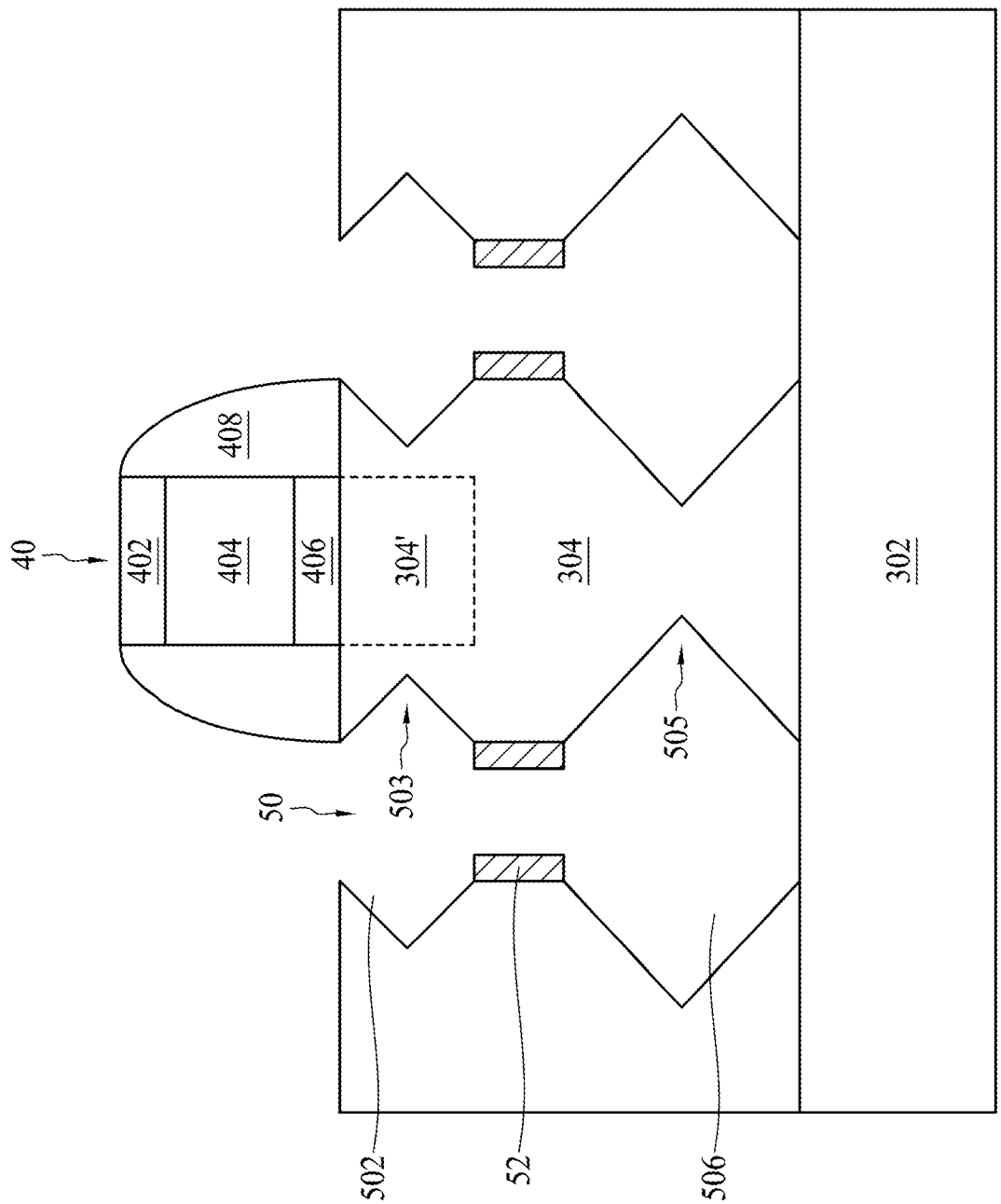
FIG. 6 is a cross-sectional view of the exemplary semiconductor device of FIG. 5 after forming first and second sigma portions in the initial cavities.

FIG. 2 is a flowchart showing a method 200 for preparing a semiconductor device 3 in accordance with an embodiment of the present disclosure. In some embodiments, the method 200 includes a number of steps (S202, S204, S206, S208 and S210) and the description and illustrations below are not deemed as a limitation to the sequence of the steps. In step S202, a semiconductor substrate 302 is provided as shown in FIGS. 3A to 3B. In step S204, an initial cavity 50 is formed by performing an anisotropic etch to remove a portion of a semiconductor fin 304 located on each side of a gate structure 40 as shown in FIG. 4. In step S206, an oxide collar 52 is formed on a middle portion of sidewalls of the initial cavity 50 as shown in FIG. 5. In step S208, a crystallographic anisotropic etch is performed to form a first sigma portion 502 above the oxide collar 52 and a second sigma portion 506 below the oxide collar 52 as shown in FIG. 6. In step S210, the oxide collar 52 is removed from the middle portion of the sidewalls of the initial cavity 50 so as to obtain a trench 50' including a first sigma portion 502, a second sigma portion 506 and a middle portion 504 connecting the first sigma portion 502 and the second sigma portion 506.

FIG. 3A is a cross-sectional view of an exemplary semiconductor device according to an embodiment of the present application that includes a semiconductor fin extending upwards from a semiconductor substrate and a gate structure formed over the semiconductor fin. FIG. 3B is another cross-sectional view of the exemplary semiconductor device of FIG. 3A taken along a direction perpendicular to the lengthwise direction of the semiconductor fin.

Referring to FIGS. 3A to 3B, the semiconductor device includes a semiconductor fin 304 extending upwards from a semiconductor substrate 302 and a gate structure 40 formed over the semiconductor fin 304. While only a single semiconductor fin 304 is shown, some embodiments may include multiple semiconductor fins formed above the semiconductor substrate 302.

The exemplary semiconductor structure shown in FIGS. 3A to 3B can be formed by first providing a bulk semiconductor substrate (not shown). A "bulk semiconductor substrate" means a substrate that is entirely composed of at least one semiconductor material having semiconducting properties. In the present application, at least an upper portion of the bulk semiconductor substrate is composed of a semiconductor material including, for example, silicon (Si), germanium (Ge), a silicon germanium (SiGe) alloy, a carbon doped silicon (Si:C) alloy, III-V compound semiconductors or II-VI compound semiconductors. In one embodiment, the semiconductor substrate is composed entirely of silicon.

The at least one semiconductor material that provides the bulk semiconductor substrate may be single crystalline, polycrystalline or amorphous. In one example, the entirety of, or at least the upper portion of, the bulk semiconductor substrate is composed of a single crystalline semiconductor material such as, for example, single crystalline silicon. In some embodiments, the thickness of the semiconductor substrate can be between about 30 µm and about 2 mm, although lesser and greater thicknesses can also be employed.

After the bulk semiconductor substrate is provided, the bulk semiconductor substrate is patterned to provide a semiconductor fin 304. In the present application, the semiconductor fin 304 is formed within the upper portion of the bulk semiconductor substrate, while the semiconductor substrate 302 represents a remaining lower portion of the bulk semiconductor substrate. A material interface 30 may or may not exist between the semiconductor fin 304 and the semiconductor substrate 302. The semiconductor fin 304 may have a circular shape or a rectangular shape. In one embodiment of the present application, the semiconductor fin 304 has a width between 5 nm and 30 nm, although lesser and greater widths can also be employed. The height of the semiconductor fin 304 can be between 30 nm and 200 nm, although lesser and greater heights can also be employed. If multiple fins are formed, each semiconductor fin 304 is spaced apart from its nearest neighboring semiconductor fin 304 by a distance. In one embodiment, the distance between neighboring semiconductor fins 304 can be between 20 nm and 1000 nm. The semiconductor fins 304 are oriented parallel to each other.

The semiconductor fin 304 can be formed by patterning the upper portion of the bulk semiconductor substrate. In one embodiment of the present application, the patterning used to provide the semiconductor fin 304 may include lithography and etching. Lithography includes forming a photoresist layer (not shown) atop the semiconductor substrate. The photoresist layer may include a positive-tone photoresist material, a negative-tone photoresist material or a hybrid-tone photoresist material. The photoresist layer may be formed by a deposition process such as, for example, spin coating. After the photoresist layer is formed, the photoresist layer is subjected to a patterned irradiation. Next, the exposed photoresist layer is developed utilizing a conventional resist developer. This provides a patterned photoresist layer atop the semiconductor substrate to be patterned. The pattern provided by the patterned photoresist layer is thereafter transferred onto the underlying semiconductor substrate utilizing at least one pattern transfer etching process. Typically, the at least one pattern transfer etching process is an anisotropic etch. In one embodiment, a dry etch such as, for example, a reactive ion etch (RIE) can be used. In another embodiment, a wet etch utilizing a chemical etchant can be used. In still a further embodiment, a combination of a thy etch and a wet etch can be used. In the illustrated embodiment, the etch stops within a portion of the bulk semiconductor substrate.

In another embodiment of the present application, the patterning used to provide a semiconductor fin 304 may include a sidewall image transfer (SIT) process. The SIT process includes forming a mandrel material layer (not shown) atop the bulk semiconductor substrate to be patterned. The mandrel material layer can include any material (semiconductor, dielectric or conductive) that can be selectively removed from the structure during a subsequently-performed etching process. In one embodiment, the mandrel material layer may be composed of amorphous silicon or polysilicon. In another embodiment, the mandrel material layer may be composed of a metal such as, for example, Al, W, or Cu. The mandrel material layer can be formed, for example, by chemical vapor deposition (CVD) or plasma-enhanced chemical vapor deposition (PECVD). In the following deposition of the mandrel material layer, the mandrel material layer can be patterned by lithography and etching to form a plurality of mandrel structures (also not shown) on the topmost surface of the bulk semiconductor substrate.

The SIT process continues with forming of a spacer on each sidewall of each mandrel structure. The spacer can be formed by depositing a spacer material and then etching the deposited spacer material. The spacer material may comprise any material having an etch selectivity that differs from that of the mandrel material. Examples of deposition processes that can be used in depositing the spacer material include, for example, CVD, PECVD or atomic layer deposition (ALD). Examples of etching that be used in providing the spacers include any etching process such as, for example, RIE.

After the formation of the spacers, the SIT process continues with removal of each mandrel structure. Each mandrel structure can be removed by an etching process that is selective for removing the mandrel material. Following the mandrel structure removal, the SIT process continues with transfer of the pattern provided by the spacers onto the underlying semiconductor substrate. The pattern transfer may be achieved by utilizing at least one etching process. Examples of etching processes that can used to transfer the pattern may include dry etch (i.e., RIE, plasma etching, ion beam etching or laser ablation) and/or wet etch. In one example, the etching process used to transfer the pattern may include one or more RIE steps. Upon completion of the pattern transfer, the SIT process concludes with removal of the spacers from the structure. The spacers may be removed by etching or a planarization process.

After the semiconductor fin 304 is formed, a shallow trench isolation (STI) 308 is formed to surround a base portion of the semiconductor fin 304. The STI 308 may include a dielectric oxide such as, for example, silicon dioxide. The STI 308 may be formed by depositing a dielectric material over the semiconductor substrate 302 and the semiconductor fin 304 using a conventional deposition technique, such as, for example, CVD or PVD, planarizing the deposited dielectric material by a conventional planarization technique such as, for example, chemical mechanical planarization (CMP), and then etching back the deposited dielectric material to the desired thickness. In some embodiments, the planarization step may be omitted. An anisotropic etch such as, for example, RIE may be employed to remove the dielectric material of the STI 308 selective to the semiconductor material of the semiconductor fin 304.

Still referring to FIGS. 3A to 3B, a gate structure 40 is formed over the semiconductor fin 304. The gate structure 40 includes a gate stack straddling a channel region 304' (i.e., the active fin region) of the semiconductor fin 304, and a gate spacer 408 present on sidewalls of each gate stack. The term "straddling" means that the gate stack is in direct contact with a top surface and two vertical sidewalls of the semiconductor fin. The gate stack may include, from bottom to top, a gate dielectric 406, a gate electrode 404 and a gate cap 402 and may be formed via any known process in the art, including a gate-first process and a gate-last process.

In a gate-first process, the gate stack (402, 404, 406) can be formed by providing a material stack (not shown) that includes, from top to bottom, a gate cap layer, a gate electrode layer and a gate dielectric layer over the semiconductor fin 304, the STI 308 and the semiconductor substrate portion 302, and lithographically patterning the material stack.

The gate dielectric layer may include any suitable insulating material including, but not limited to, oxides, nitrides or oxynitrides. In one embodiment, the gate dielectric layer may include a high-k dielectric having a dielectric constant greater than that of silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3H_yO_xN_y$, $ZrO_xN_y$, $La_2O_xN_y$, $Al_2O_xN_y$, $TiOxNy$, $SrTiO_xN_y$, $LaAlO_xN_y$, $Y_2O_xN_y$, $SiON$, $SiN_x$, silicates thereof, and alloys thereof. Each value of x is independently between 0.5 and 3 and each value of y is independently between 0 and 2. In some embodiments, a multilayered gate dielectric structure comprising different gate dielectric materials, e.g., silicon dioxide, and a high-k dielectric, can be formed. The gate dielectric layer can be formed by any deposition technique including, for example, CVD, PECVD, PVD or atomic layer deposition (ALD). Alternatively, the gate dielectric layer can be formed by a thermal growth process such as, for example, oxidation, nitridation or oxynitridation to convert surface portions of the semiconductor fin 304 into a dielectric material. The gate dielectric layer that is formed can have a thickness between 0.5 nm and 10 nm, with a thickness between about 0.5 nm and about 3 nm being more typical.

The gate electrode layer may include any conductive material including, for example, doped polysilicon, an elemental metal such as W, Ti, Ta, Al, Ni, Ru, Pd and Pt, an alloy of at least two elemental metals, a metal nitride such as WN and TiN, a metal silicide such as WSi, NiSi, and TiSi, or multilayered combinations thereof. The gate electrode layer can be formed utilizing a deposition process including, for example, CVD, PECVD, PVD or ALD. In embodiments in which polysilicon or SiGe are used as the gate electrode material, an in-situ deposition process can be used or, alternatively, deposition followed by ion implantation can be used. The gate electrode layer that is formed can have a thickness between 50 nm and 200 nm, although lesser or greater thicknesses can also be employed.

The gate cap layer may include a dielectric oxide, a dielectric nitride or a dielectric oxynitride. In one embodiment of the present application, the gate cap layer includes silicon nitride. The gate cap layer can be formed by a deposition process including, for example, CVD, PECVD, PVD or ALD. The gate cap layer that is formed can have a thickness between 25 nm and 100 nm, although lesser or greater thicknesses can also be employed.

The lithographic patterning of the material stack can be performed by an anisotropic etch, which can be a dry etch such as, for example, RIE, or a wet etch. Each remaining portion of the gate dielectric layer constitutes a gate dielectric 406, each remaining portion of the gate electrode layer constitutes a gate electrode 404, and each remaining portion of the gate cap layer constitutes a gate cap 402.

In a gate-last process, the gate stack (402, 404, 406) may include a sacrificial gate (not shown) that may be later removed and replaced by a gate dielectric and a gate electrode such as those of the gate-first process described above. In an exemplary embodiment, the sacrificial gate may be made of polysilicon with a sacrificial dielectric material (e.g., silicon dioxide) formed using deposition techniques known in the art including, for example, ALD, CVD and PVD.

Each gate spacer 408 may include a dielectric material such as, for example, an oxide, a nitride, an oxynitride, or any combination thereof. In one embodiment, each gate spacer 408 is composed of silicon nitride. The gate spacers 408 can be formed by first providing a conformal gate spacer material layer (not shown) on exposed surfaces of the gate stacks (402, 404, 406), the semiconductor fin 304, the STI 308 and the semiconductor substrate 302 and then etching the gate spacer material layer to remove horizontal portions of the gate spacer material layer. The gate spacer material layer can be provided by a deposition process including, for example, CVD, PECVD or ALD. The etching of the gate spacer material layer may be performed by a dry etch process such as, for example, RIE. The remaining vertical portions of the gate spacer material layer constitute the gate spacers 408. The width of each gate spacer 408, as measured at the base of the gate spacer 408 can be between 5 nm and 100 nm, although lesser and greater widths can also be employed.

FIG. 4 illustrates an exemplary semiconductor structure of FIG. 3A after initial cavities 50 are formed within the semiconductor fin 304 on opposites sides of the gate structures 40. The initial cavities 50 may have a rectangular shape with substantially vertical sidewalls. The sidewalls of the initial cavities 50 are vertically coincident with (i.e., vertically aligned to) outer sidewalls of the gate spacers 408. The initial cavities 50 may be formed by performing an anisotropic etch that removes portions of the semiconductor fin 304 that are not covered by the gate structures 40. In one embodiment, an RIE process using, for example, chlorine, may be performed. In some embodiments, the initial cavities 50 may have a depth of about 5 nm to 10 nm, although lesser and greater depths can also be employed.

FIG. 5 illustrates the exemplary semiconductor structure of FIG. 4 after forming of oxide collars 52 on a middle portion of sidewalls of the initial cavities 50 by performing an annealing process. The annealing process is performed in an oxygen-containing environment to selectively oxidize the middle portion of sidewalls of the initial cavities 50 to form the oxide collar 52. Annealing is preferably performed at a temperature between about 900° C. and 1150° C., and more preferably at about 1050° C.

FIG. 6 illustrates the exemplary semiconductor structure of FIG. 5 after first sigma portions 502 and second sigma portions 506 are formed in the initial cavities 50 by performing a crystallographic anisotropic etch. The crystallographic anisotropic etch is also referred to as a sigma cavity etch. In some embodiments, the sigma cavity etch may comprise a wet etch using, for example, tetramethylammonium hydroxide (TMAH), ammonium hydroxide, and/or potassium hydroxide as an etchant. The etchant etches (001) and (110) crystallographic planes faster than (111) crystallographic planes, forming first sigma cavities 32 with faceted surfaces oriented along (111) planes (herein referred to as (111) faceted surfaces). The first sigma portion 502 contains a first horizontal tip region 503 protruding in a lateral direction toward an adjacent channel region 304' and extending beneath the gate spacer 408. The first horizontal tip region 503 comprises an intersection of two faceted surfaces. In some embodiments, the second sigma portion 506 has a depth greater than that of the first sigma portion 502. The second sigma portion 506 also contains a second horizontal tip region 505 protruding in a lateral direction toward an adjacent channel region 304' and extending beneath the gate spacer 408. In some embodiments, the second horizontal tip region 505 protrudes farther than the first horizontal tip region 503.

FIG. 7 illustrates the exemplary semiconductor structure of FIG. 6 after the oxide collar 52 is removed from the middle portion of sidewalls of the initial cavities 50 so as to obtain a trench 50'. The trench 50' includes a middle portion 504 connecting the first sigma portion 502 and the second sigma portion 506.

FIG. 8 illustrates the exemplary semiconductor structure of FIG. 7 after a semiconductor buffer region 60 is epitaxially grown on (111) faceted surfaces of the first sigma portion 502. The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a (111) crystal surface may take on a (111) orientation. In some embodiments, epitaxial growth and/or deposition processes may be selective to forming on semiconductor surfaces, and may not deposit material on dielectric surfaces, such as silicon dioxide or silicon nitride surfaces.

The semiconductor buffer regions 60 may include an intrinsic (i.e., un-doped) semiconductor material that has a greater or smaller lattice constant than that of the semiconductor material that provides the semiconductor fin 304, and thus the semiconductor buffer regions 60 introduce stress to the channel regions 304' of the semiconductor fin 304. If the lattice constant of the semiconductor material that provides the semiconductor buffer regions 60 is greater than the lattice constant of the semiconductor material that provides the semiconductor fin 304, a compressive stress can be applied to the channel regions 304'. If the lattice constant of the semiconductor material that provides the semiconductor buffer regions 60 is less than the lattice constant of the semiconductor material that provides the semiconductor fin 304, a tensile stress can be applied to the channel regions 304'. For example, in instances where the semiconductor fin 304 is composed of silicon, for p-type FinFETs, the semiconductor buffer regions 60 may include a SiGe alloy containing, for example, about 10-80 atomic % of germanium to induce a compressive stress toward the channel regions 304', while for n-type FinFETs, the semiconductor buffer regions 60 may include a Si:C alloy containing, for example, about 0.4-3.0 atomic % of carbon to induce a tensile stress toward the channel regions 304'.

The semiconductor buffer regions 60 may be formed by a first selective epitaxial growth process. The first selective epitaxial growth process deposits the semiconductor material that provides the semiconductor buffer regions 60 only on the semiconductor surfaces (i.e., (111) faceted surfaces), but not on dielectric surfaces, such as gate caps 402, gate spacers 408 and STI 308. In one embodiment, the semiconductor buffer regions 60 are formed, for example, by CVD, molecular beam epitaxy (MBE), metal-organic chemical vapor deposition (MOCVD), or other suitable processes.

Due to the fact that the epitaxial growth rate on (111) planes is considerably less than that on (110) and (100) planes (with (100) being the fastest), the deposited semiconductor material grows faster at the first horizontal tip region 503, the middle portion 504 and the second sigma portion 506 than at sidewall regions having (111) faceted surfaces. The selective epitaxial growth process can proceed such that the horizontal tip region 503 and the middle portion 504 and the second sigma portion 506 are completely filled by the semiconductor buffer region 60, and a remaining unfilled portion of the first sigma portion 502 has a box shape with substantially vertical sidewalls. Because the growth at the middle portion 504 and the second sigma portion 506 is the fastest, a horizontal portion of each semiconductor buffer region 60 has a thickness greater than a thickness of the vertical portion. At this point of the method and as shown in FIG. 8, a part of the first sigma portion 502 remains unfilled after formation of the semiconductor buffer regions 60.

FIG. 9 illustrates the first exemplary semiconductor structure of FIG. 8 after a doped semiconductor region 80 is formed on each semiconductor buffer region 60 to completely fill the remaining unfilled portion of the first sigma portion 502. As a result, a filled trench 50" including a first sigma portion 502', a second sigma portion 506' and a middle portion 504 is obtained. As can be seen, the first sigma portion 502', the second sigma portion 506' and the middle portion 504' correspond to the first sigma portion 502, the second sigma portion 506 and the middle portion 504 after being filled by the semiconductor buffer region 60 and/or the doped semiconductor region. Each doped semiconductor region 80 and an underlying semiconductor buffer region 60 constitute a source/drain structure. The doped semiconductor regions 80 may include a semiconductor material that can induce the same type of stress to the channel regions 304' of the semiconductor fin 304 as the underlying semiconductor buffer regions 60. In one embodiment, the doped semiconductor regions 80 may be comprised of the same semiconductor material as the semiconductor buffer regions 60. The doped semiconductor regions 80 also include p-type or n-type dopants. The term "p-type" refers to the addition of impurities to an intrinsic semiconductor that creates deficiencies of valence electrons. Examples of p-type dopants, i.e., impurities, include, but are not limited to, boron, aluminum, gallium, and indium. "N-type" refers to the addition of impurities that contributes free electrons to an intrinsic semiconductor. Examples of n-type dopants, i.e., impurities, include, but are not limited to, antimony, arsenic, and phosphorous. In one embodiment, for p-type FinFETs, the doped semiconductor regions 80 may be composed of boron doped SiGe, while for n-type FinFETs, the doped source/drain regions 80 may be composed of phosphorous doped Si:C. The dopant centration of the doped semiconductor regions 80 can be between $1.0 \times 10^{20}$ atoms/cm$^3$ and $3.0 \times 10^{21}$ atoms/cm$^3$, although lesser and greater atomic concentrations can also be employed.

The doped semiconductor regions 80 may be formed by a second selective epitaxial growth process. The second selective epitaxial growth process deposits a doped semiconductor material by in-situ doping, and is herein referred to as an in-situ doped selective epitaxial growth process.

After the doped semiconductor regions 80 are provided, the dopants in the doped semiconductor regions 80 may be activated by a thermal annealing. Thermal annealing can be performed by a rapid thermal anneal process, a laser anneal process or a furnace anneal process. During the annealing process, the dopants contained within the doped semiconductor regions 80 diffuse into the semiconductor buffer regions 60 and the semiconductor fin 304, thereby forming source/drain junctions between the doped semiconductor regions 80 and the channel regions 304'. In the present application, since the doped semiconductor regions 80 have substantially vertical sidewalls, after annealing, uniform source/drain junctions along the fin height direction are formed between the channel regions 304' and the doped semiconductor regions 80. The undesirable gate length variation encountered in the prior art can thus be resolved.

With the above-mentioned configurations of the semiconductor device and methods for preparing the same, the volume of each source/drain cavity is increased, and more stress-generating material can be deposited therein so as to create more stress on the channel regions of the FinFETs. As a result, operating speed of the FinFETs can be greatly enhanced.

One aspect of the present invention provides a semiconductor device including a semiconductor substrate, a semiconductor fin and a filled trench. The semiconductor fin extends upwards from the semiconductor substrate. The filled trench is formed in the semiconductor fin and includes a first sigma portion, a second sigma portion and a middle portion. The first sigma portion is partially filled by a semiconductor buffer region, and an unfilled part of the first sigma portion is filled by a doped semiconductor region grown on the semiconductor buffer region. The second sigma portion is filled by the semiconductor buffer region. The middle portion connects the first sigma portion to the second sigma portion, and the middle portion is filled by the semiconductor buffer region.

Another aspect of the present invention provides a method for preparing a semiconductor device. The method includes steps of providing a semiconductor substrate; forming a trench in the semiconductor substrate, wherein the trench includes a first sigma portion, a second sigma portion and a middle portion connecting the first and second sigma portions; epitaxially growing a semiconductor buffer region in the trench, wherein the semiconductor buffer region fills the second sigma portion, the middle portion and a part of the first sigma portion; and epitaxially growing a doped semiconductor region on the semiconductor buffer region, wherein the doped semiconductor region fills an unfilled part of the first sigma portion.

Another aspect of the present invention provides a method for preparing a semiconductor device. The method includes steps of providing a semiconductor substrate; forming an initial cavity by performing an anisotropic etch to remove a portion of a semiconductor fin located on each side of a gate structure; forming an oxide collar on a middle portion of sidewalls of the initial cavity; performing a crystallographic anisotropic etch to form a first sigma portion above the oxide collar and a second sigma portion below the oxide collar; and removing the oxide collar from the middle portion of the sidewalls of the initial cavity so as to obtain a trench including a first sigma portion, a second sigma portion and a middle portion connecting the first sigma portion and the second sigma portion.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device, comprising:
   providing a semiconductor substrate;
   forming a gate structure over a semiconductor fin that extends upwards from the semiconductor substrate, wherein the gate structure comprises a gate stack straddling a channel portion of the semiconductor fin and a gate spacer present on sidewalls of the gate stack;
   forming a horizontal tip region extending beneath the gate spacer and a bottom region extending toward the semiconductor substrate portion in the first sigma portion;
   forming a trench in the semiconductor substrate, wherein the trench includes a first sigma portion, a second sigma portion and a middle portion connecting the first and second sigma portions;
   epitaxially growing a semiconductor buffer region in the trench, wherein the semiconductor buffer region fills the second sigma portion, the middle portion and a part of the first sigma portion; and
   epitaxially growing a doped semiconductor region on the semiconductor buffer region, wherein the doped semiconductor region fills an unfilled part of the first sigma portion;
   wherein forming the trench further comprises:
   forming an initial cavity by performing an anisotropic etch to remove a portion of the semiconductor fin located on each side of the gate structure, wherein the initial cavity has a sidewall vertically coincident with an outer sidewall of the gate spacer; and
   forming an oxide collar on a middle portion of sidewalls of the initial cavity.

2. The method of claim 1, wherein forming the trench further comprises performing a crystallographic anisotropic etch to form the first sigma portion above the oxide collar and the second sigma portion below an oxide collar, wherein the first and second sigma portions have faceted surfaces oriented along (111).

3. The method of claim 2, wherein forming the trench further comprises removing the oxide collar from the middle portion of the sidewalls of the initial cavity, such that the middle portion of the trench connects the first sigma portion and the second sigma portion.

4. The method of claim 2, wherein the crystallographic anisotropic etch uses etchant including at least one of tetramethylammonium hydroxide (TMAH), ammonium hydroxide and potassium hydroxide.

5. The method of claim 4, wherein the etchant etches (001) and (110) crystallographic planes faster than (111) crystallographic planes.

6. A method for preparing a semiconductor device, comprising:
   providing a semiconductor substrate;
   forming an initial cavity by performing an anisotropic etch to remove a portion of a semiconductor fin located on each side of a gate structure;
   forming an oxide collar on a middle portion of sidewalls of the initial cavity;
   performing a crystallographic anisotropic etch to form a first sigma portion above the oxide collar and a second sigma portion below the oxide collar; and
   removing the oxide collar from the middle portion of the sidewalls of the initial cavity so as to obtain a trench including a first sigma portion, a second sigma portion and a middle portion connecting the first sigma portion and the second sigma portion.

7. The method of claim 6, further comprising:
   forming a gate structure over a semiconductor fin that extends upwards from the semiconductor substrate, wherein the gate structure comprises a gate stack straddling a channel portion of the semiconductor fin and a gate spacer present on sidewalls of the gate stack; and
   forming a horizontal tip region extending beneath the gate spacer and a bottom region extending toward the semiconductor substrate portion in the first sigma portion.

8. The method of claim 7, wherein the initial cavity has a sidewall vertically coincident with an outer sidewall of the gate spacer.

9. The method of claim 8, wherein the first and second sigma portions have faceted surfaces oriented along (111).

10. The method of claim 7, further comprising:
    epitaxially growing a semiconductor buffer region in the trench, wherein the semiconductor buffer region fills the second sigma portion, the middle portion and a part of the first sigma portion; and
    epitaxially growing a doped semiconductor region on the semiconductor buffer region, wherein the doped semiconductor region fills an unfilled part of the first sigma portion.

11. The method of claim 10, wherein the semiconductor buffer region fills the horizontal tip region and the bottom region of the first sigma portion.

12. The method of claim 11, wherein the second sigma portion has a depth greater than that of the first sigma portion.

* * * * *